(12) United States Patent
Yamamuka et al.

(10) Patent No.: US 6,273,957 B1
(45) Date of Patent: Aug. 14, 2001

(54) VAPORIZING DEVICE FOR CVD SOURCE MATERIALS AND CVD APPARATUS EMPLOYING THE SAME

(75) Inventors: Mikio Yamamuka; Tsuyoshi Horikawa; Takaaki Kawahara; Fusaoki Uchikawa; Shigeru Matsuno; Takehiko Sato; Akira Yamada; Masayoshi Tarutani, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/532,446

(22) Filed: Mar. 23, 2000

(30) Foreign Application Priority Data

Mar. 25, 1999 (JP) .................................................. 11-081499

(51) Int. Cl.$^7$ .................................................... C23C 16/00
(52) U.S. Cl. ........................... 118/724; 118/726; 392/394; 392/396; 392/397; 392/399; 392/400
(58) Field of Search .................................. 118/724, 726; 392/394, 396, 397, 399, 400

(56) References Cited

U.S. PATENT DOCUMENTS

| 4,219,725 | * | 8/1980 | Groninger | 219/272 |
| 4,725,712 | * | 2/1988 | Schroeder | 219/276 |
| 5,372,754 | * | 12/1994 | Ono | 261/142 |
| 5,835,677 | * | 11/1998 | Li et al. | 392/401 |
| 6,039,808 | | 3/2000 | Toyoda et al. | 118/715 |
| 6,074,487 | * | 6/2000 | Yoshioka et al. | 118/726 |

FOREIGN PATENT DOCUMENTS 9-036108    2/1997   (JP) .
9-143738    6/1997   (JP) .

* cited by examiner

Primary Examiner—Richard Bueker
(74) Attorney, Agent, or Firm—Leydig, Voit & Mayer, Ltd.

(57) ABSTRACT

A vaporizing device for chemical vapor deposition (CVD) source materials includes a vaporizer for vaporizing introduced CVD source materials by heating, a spray nozzle of which an end portion is fixedly attached to the vaporizer for spraying the CVD source materials into the vaporizer, a cooling mechanism for cooling the spray nozzle, and a heat conduction restrictor attached to the end portion, proximate of the end portion, or to the vaporizer. Generation of non-vaporized residues and particles is decreased, improving productivity owing to prolongation of continuous operation time of the apparatus and a decrease in film defects.

20 Claims, 6 Drawing Sheets

VAPORIZING DEVICE FOR CVD SOURCE MATERIALS AND CVD APPARATUS EMPLOYING THE SAME

BACKGROUND OF THE INVENTION

The present invention relates to a vaporizing device for CVD source materials for a solution or a liquid used for CVD (chemical vapor deposition) forming of dielectric films, ferroelectric films, electrodes or wiring materials used in semiconductor memories, system LSI, electrical devices and the like as well as to a CVD apparatus employing the same.

Rapid progresses are being made in integration of memory devices utilized in semiconductors, and it is the case with dynamic random access memories (DRAMs) that progresses in integration thereof resulted in bit numbers are four times the number they were three years ago. Such progresses were made for the aim of achieving high speed, low electric consumption or low cost of devices. However, no matter how much integration shall be improved, capacitors which are components of DRAMs still need to keep a specified capacity for securing reliability.

For this purpose, it is required to achieve thinning of film thickness of capacitor materials while limits were found in thinning of $SiO_2$ which is a commonly used material so far. Therefore, in view of the fact that improvements in permittivity by using different materials make it possible to secure a certain capacity as well as thinning, studies are being made in which dielectric materials (materials of high permittivity) are used as capacitor materials for memory devices.

On the other hand, ferroelectric memories are being paid attention to as one form of nonvolatile memories which do not require electric power for maintenance of memories. Such memories are so arranged that polarization and inversion, which are material characteristics of ferroelectrics, are made to correspond to presence or absence of memories and are advantaged in that they are not only nonvolatile but also capable of presenting high-speed actions and high integration, depending on improvements in material characteristics.

On the other hand, it has been considered to employ Pt or Ru as materials for electrodes as components of such semiconductor chips, and to employ copper as materials for wiring instead of conventionally used aluminum for the purpose of decreasing occurrence of delays owing to low resistance (of achieving rapidness of operating speed).

Characteristics which are required for such materials for capacitors are that they are thin films presenting high permittivity and that their leak current is small, while it is additionally required for ferroelectric materials that they present polarizing characteristics. That is, as long as materials of high permittivity are used, it is required to form a film having a minimum thickness and to set the leak current thereof also to minimum. In general, an approximate target for development is favorably set to be a film thickness of not more than 1 nm based on $SiO_2$ conversion and a leak current density of an order of not more than $10^{-8}$ A/cm$^2$ when applying a voltage of 1.65V.

Materials for electrodes are further required to present low reactivity with the dielectric materials to be used in combination and to be capable of being easily processed, and materials for wiring are further required to present a resistivity which is smaller than that of conventionally used aluminum.

Further, for the purpose of forming a thin film above electrodes of DRAM capacitors or ferroelectric memory cells which are arranged in a stepped manner, or vice versa, for forming electrodes or wirings above such a thin film, it is of remarkable advantage in view of processing that film formation can be performed through CVD methods wherein materials present favorable adhesiveness to base materials of complicated shapes and mass production is enabled.

In view of these facts, it has been considered to form oxide group dielectric films through CVD film forming methods utilizing, as materials for capacitors as well as ferroelectric materials, tantalum oxide, lead zirconate titanate (PZT), lead lanthanum zirconate titanate (PLZT), strontium titanate (ST), barium titanate (BT), barium-strontium titanate (BST) or strontium-bismuth tantalunate (SBT). Further, materials for metallic electrodes for the oxide films might be Pt or Ru, materials for oxide group conductive electrodes $RuO_2$ or $SrRuO_3$, and materials for wiring Cu.

Since it is most advantageous to form films by using CVD methods, various CVD source materials for performing CVD film forming utilizing these materials have been developed, wherein many thereof are either in a liquid or in a solid state, and in case of solid source materials, these are used as source material solutions after being dissolved in suitable solvents.

For instance, Japanese Unexamined Patent Publication No. 158328/1994 discloses CVD source materials wherein conventional solid source materials are dissolved in an organic solvent of tetrahydrofuran (THF) to obtain a solution whereby vaporizing characteristics and compositional controllability have been remarkably improved, and Japanese Unexamined Patent Publication No. 310444/1994 further discloses a CVD apparatus.

However, while quite favorable vaporizing characteristics and compositional controllability could be achieved by using the above conventional source material solution in the above CVD apparatus, insufficient performance of the vaporizing device made it impossible to avoid generating of non-vaporized residues within a vaporizer or a spray nozzle thereof.

There was presented a drawback that such residues reached a CVD reactor in forms of particles to cause deficiencies in film forming and thus to degrade repeatability of film forming and that elongation of continuous operation time of the vaporizer was hindered thereby resulting in degradation of productivity for manufacturing memories.

That is, the above vaporizing device is so arranged that carburetion of source materials is performed by spraying solutions or liquid source materials into a heated vaporizer by means of a spray nozzle; however, since this mechanism is insufficient, thermal hysteresis of materials until vaporizing temperatures are reached become slacked, so that a part thereof is degraded by thermal decomposition or by formation of origomer before reaching into the vaporizer to thereby cause generation of non-vaporized residues.

On the other hand, since liquid source materials used for copper wirings are liable to cause thermal decomposition, generation of decompositions within the vaporizer was inevitable.

As discussed above, solutions or liquid source materials are generally liable to cause thermal decomposition, and the degree of decomposition was largely dependent on the performance of the vaporizing device.

The present invention has been made to solve these subjects, and it is an object thereof to obtain a vaporizing device for CVD source materials capable of restricting generation of non-vaporized residues and particles, and of achieving elongation of continuous operation time of the vaporizing device and decrease of occurrence of deficiencies in film forming.

It is further an object of the present invention to obtain a CVD apparatus capable of performing superior film forming by utilizing the above vaporizing device for CVD source materials to thereby improve productivity of manufacture of memories or the like.

SUMMARY OF THE INVENTION

A first vaporizing device for CVD source materials according to the present invention comprises a vaporizer for vaporizing introduced CVD source materials through heating, a spray nozzle of which end portion is fixedly attached to the vaporizer for spraying the CVD source materials into the vaporizer, a cooling mechanism for cooling the spray nozzle, and a heat conduction restricting means attached either to the fixing portion, or to proximate of the fixing portion of the spray nozzle or the vaporizer.

A second vaporizing device for CVD source materials according to the present invention is so arranged that the first vaporizing device for CVD source materials further includes a heat insulating mechanism for thermally insulating the vaporizer from the cooled spray nozzle.

A third vaporizing device for CVD source materials according to the present invention is so arranged that in the first or second vaporizing device for CVD source materials, the heat conduction restricting means is configured to assume a wall thickness which is smaller than a wall thickness of the vaporizer or the spray nozzle disposed in the periphery of the heat conduction restricting means.

A fourth vaporizing device for CVD source materials according to the present invention is so arranged that in the third vaporizing device for CVD source materials, the heat conduction restricting means is formed of a metallic plate of which thickness is smaller than the wall thickness of the vaporizer.

A fifth vaporizing device for CVD source materials according to the present invention is so arranged that in the fourth vaporizing device for CVD source materials, at least a part of a wall surface of the metallic plate of a small thickness is covered by glass, ceramics or heat-resisting plastics.

A sixth vaporizing device for CVD source materials according to the present invention is so arranged that in either one of the first to fifth vaporizing devices for CVD source materials, the spray nozzle is a nozzle which is configured to make gas containing the CVD source materials and spray gas for spraying the CVD source materials flow in a separate manner.

A seventh vaporizing device for CVD source materials according to the present invention is so arranged that in the sixth vaporizing device for CVD source materials, the spray nozzle is formed as a coaxial double tube structure composed of an inner tube and an outer tube wherein gas containing the CVD source materials is made to flow through one of the tubes and spray gas for spraying the CVD source materials is made to flow through the other one of the tubes.

An eighth vaporizing device for CVD source materials according to the present invention is so arranged that in the seventh vaporizing device for CVD source materials, coaxial double tube is made of metal, resin or a complex of these.

A ninth vaporizing device for CVD source materials according to the present invention is so arranged that in the eighth vaporizing device for CVD source materials, either a tip end portion of the coaxial double tube or the tube through which the CVD source material is made to flow is formed of resin.

A tenth vaporizing device for CVD source materials according to the present invention is so arranged that in the eighth vaporizing device for CVD source materials, the outer tube of the coaxial double tube is formed of metal.

An eleventh vaporizing device for CVD source materials according to the present invention is so arranged that in either one of the eighth to tenth vaporizing devices for CVD source materials, the resin is fluorine group resin, polyimide or polybenzimidazole.

A twelfth vaporizing device for CVD source materials according to the present invention is so arranged that in either one of the first to seventh vaporizing devices for CVD source materials, a surface of an inner wall of the spray nozzle or the vaporizer is provided with a coating film of nickel, chrome or an oxide thereof; a coating film of an alloy including as main components nickel or chrome, or an oxide thereof; a coating film of heat-resisting resin; a coating film of holohyaline; or a coating film of ceramics.

A thirteenth vaporizing device for CVD source materials according to the present invention comprises a vaporizer for vaporizing introduced CVD source materials through heating and a spray nozzle for spraying the CVD materials into the vaporizer, wherein a surface of an inner wall of the spray nozzle or the vaporizer is provided with a coating film of nickel, chrome or an oxide thereof; a coating film of an alloy including as main components nickel or chrome, or an oxide thereof; a coating film of heat-resisting resin; a coating film of holohyaline, or a coating film of ceramics.

A fourteenth CVD apparatus according to the present invention comprises any one of the above first to thirteenth vaporizing devices for CVD source materials; a supply portion for supplying the CVD source materials into the vaporizing device for CVD source materials; and a reacting portion for forming a film on a substrate through reaction of the source materials which have been vaporized by the vaporizing device for CVD source materials.

DETAILED DESCRIPTION

Embodiment 1

Figure 1:
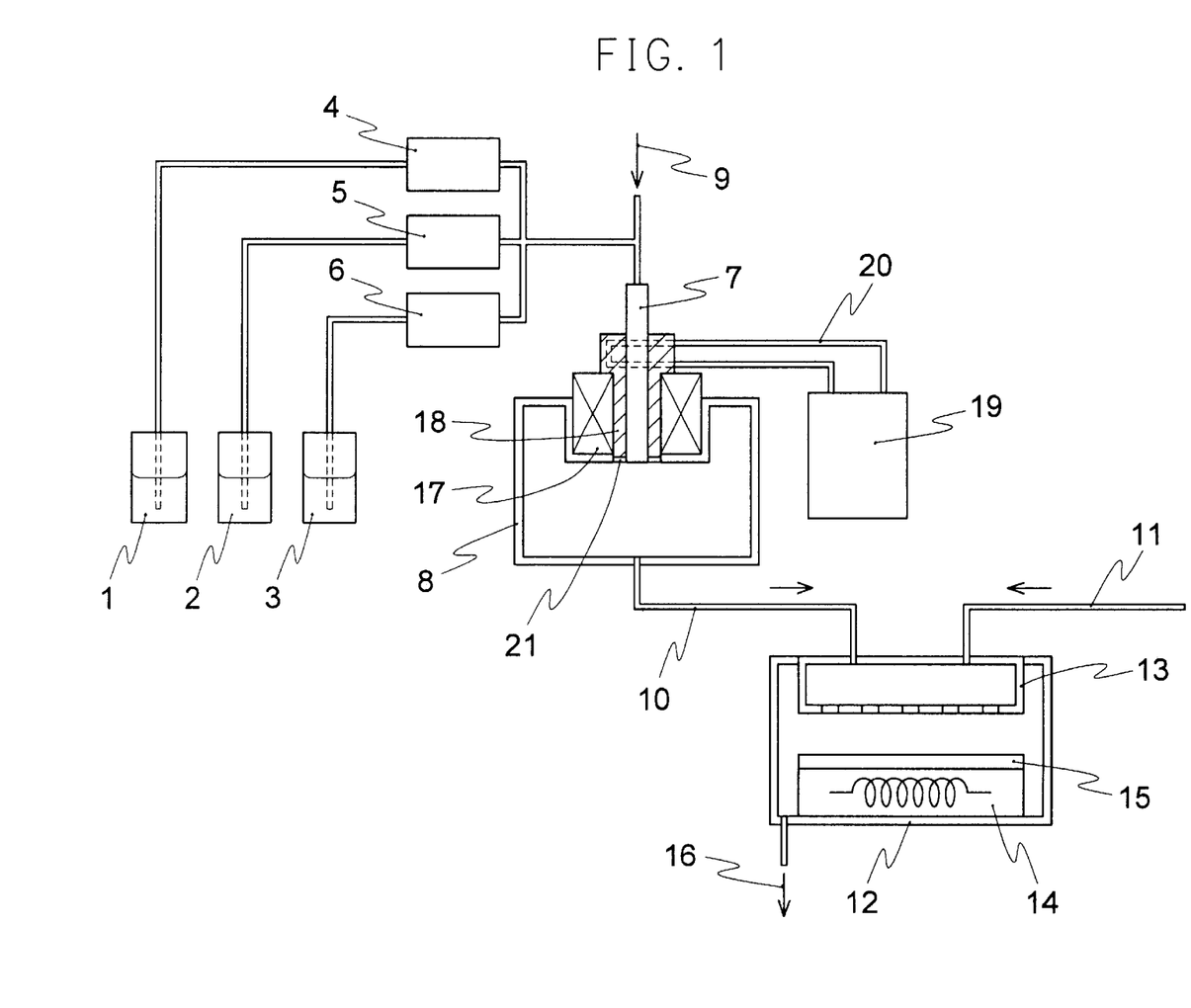
FIG. 1 is a schematic view of a CVD apparatus employing the vaporizing device for CVD source materials according to a first embodiment of the present invention.

FIG. 1 is a schematic view showing an arrangement of the CVD apparatus utilizing the vaporizing device for CVD source materials according to a first embodiment of the present invention. In the drawing, numerals 1 to 3 denote source material solutions, numerals 4 to 6 solution supplying means, numeral 7 a spray nozzle, and numeral 8 a vaporizer. The source material solutions are sprayed into the vaporizer 8 through the spray nozzle 7. Numeral 9 denotes a spray gas supplying tube, numeral 17 is, for instance, a vacuum heat insulating portion serving as a heat insulating mechanism, numeral 18 a metallic block, numeral 19 a cooling device, numeral 20 a cooling liquid flow path. The metallic block 18, cooling device 19 and cooling liquid flow path 20 make up a cooling mechanism. Numeral 21 denotes a heat conduction restricting means wherein the vaporizer 8 and the spray nozzle 7 are fixedly attached to each other through this heat conduction restricting means 21.

The vaporizing device for CVD source materials according to the present invention comprises the vaporizer 8 having a heating wall surface and the spray nozzle 7 for spraying the CVD source materials, which are either solutions or liquids, into the vaporizer 8 wherein the spray nozzle 7 is cooled through the cooling mechanism and the heat conduction restricting means 21 is provided either at the fixing portion of the spray tip end of the spray nozzle 7 and the vaporizer 8 or proximate to the fixing portion of the spray nozzle or the vaporizer. The device of the present embodiment is further configured to thermally insulate the cooled spray nozzle 7 from the vaporizer 8 through the heat insulating mechanism 17.

It should be noted that in FIG. 1, numeral 10 denotes a source material gas supply tube, numeral 11 a reaction gas supply tube, numeral 12 a CVD reactor, numeral 13 a CVD gas nozzle, numeral 14 a substrate heating heater, numeral 15 a substrate and numeral 16 exhaust.

In the vaporizing device for CVD source materials of the above-described embodiment, solutions 1 to 3 contained in the source material vessels are sprayed for carburetion by required amounts from the liquid supply vessels 4 to 6 through the spray nozzle 7 into the heated vaporizer 8 together with inert spray gas such as nitrogen, helium or argon from the spray gas supply tube 9.

Then, the vaporized source materials are sent into the CVD reactor 12 provided with the substrate heating heater 14 by passing through the source material gas supply tube 10 and are intermingled within the CVD gas nozzle 13 with reaction gas which is sent through the reaction (oxide) gas supply tube 11 such that a CVD film (dielectric film) is disposed on the substrate 15.

At this time, the spray nozzle 7 is cooled to assume an arbitrary temperature up to a point located immediately in front of the connecting portion with the vaporizer 8 by means of the cooling mechanism composed of the cooling device 19, cooling liquid flow path 20 and metallic block 18, and the end portion through which the source material solutions are sprayed is fixedly attached to the vaporizer 8 via the heat conduction restricting means 21 so that the spray nozzle 7 is thermally separated from the heated vaporizer 8.

It should be noted that owing to the arrangement of the present embodiment wherein the cooled spray nozzle 7 is thermally insulated from the vaporizer 8 by utilizing the heat insulating mechanism 17 as shown in FIG. 1, the spray nozzle 7 can be more reliably thermally separated from the heated vaporizer 8, while the spray nozzle 7 can be thermally separated from the heated vaporizer 8 by means of the heat conduction restricting means 21 also in the absence of the heat insulating mechanism. Thus, generation of non-vaporized residues and particles within the vaporizing device (vaporizer or spray nozzle) can be decreased and it is enabled to achieve for improvements in productivity owing to elongation of successive operating time of the vaporizing device and decrease in film forming deficiencies.

Figure 2A:
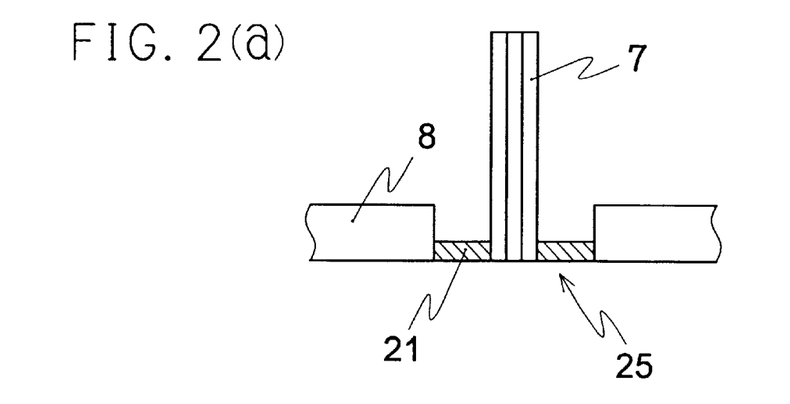
FIGS. 2(a), 2(b), and 2(c) are explanatory views showing, in enlarged views, a fixing portion between a vaporizer and a spray nozzle according to three alternative embodiments of the present invention.
Figure 2B:
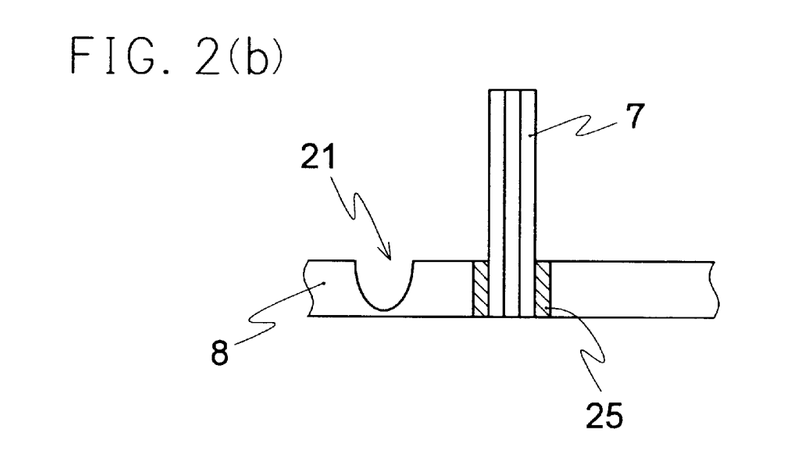
Figure 2C:
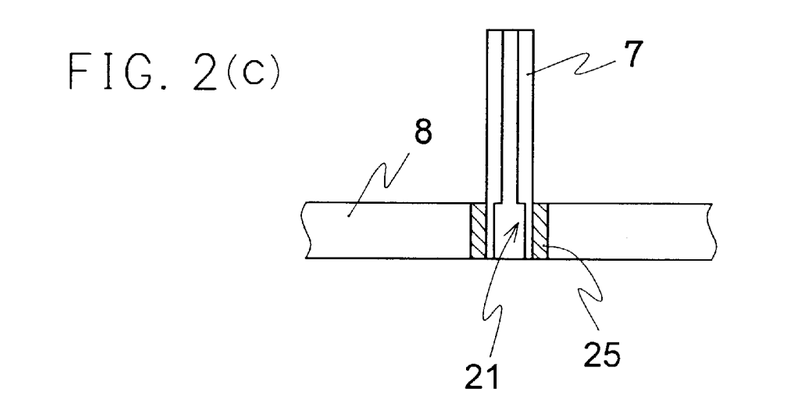

The heat conduction restricting means 21 according to the present invention shall be capable of forming a region which exhibits smaller heat conductivity than the peripheral vaporizer 8 or the main body of the spray nozzle 7. FIG. 2 is an explanatory view showing an enlarged view of a fixing portion between the vaporizer 8 and the spray nozzle 7 in the present invention wherein 25 denotes a fixing portion in the drawing.

FIG. 2(a) is view schematically showing, in an enlarged condition, a portion of FIG. 1 which is provided with the heat conduction restricting means 21 wherein the heat conduction restricting means 21 is exemplified as to be formed of a metallic plate of a small thickness which is thinner than a thickness of walls of metallic portions composing the main body of the vaporizer 8. The heat conduction restricting means 21 is, as shown in the drawing, composed of the fixing portion 25 which fixedly attaches the vaporizer 8 with the spray nozzle 7. In this case, the thickness of the metallic plate of small thickness shall be smaller than the wall thickness of the vaporizer 8 and its approximate thickness shall be not more than approximately 1 mm. Utilization of metal makes it possible to perform welding with the vaporizer or the spray nozzle to thereby provide air-tightness.

The heat conduction restricting means 21 might be formed of a metallic plate of a small thickness made of e.g. stainless steel, nickel, nickel alloy, platinum or cobalt alloy; or of glass, ceramics, heat-resistant plastics or a combination of these.

Heat conduction can be restricted by coating at least a part of wall surfaces of the metallic plates of a small thickness with glass, ceramics or heat-resistant plastics, and especially by coating inner walls of the metallic plates of a small thickness, there can be achieved for effects that vaporized gas can be prevented from depositing to be adhered to the metallic plates.

As shown in FIGS. 2(b) and (c), by forming a notch on a part of walls of the vaporizer 8 or the main body of the spray nozzle 7 proximate to the fixing portion 25 between the vaporizer 8 and the spray nozzle 7 for forming regions which are thinner than the wall thickness of the vaporizer 8 or the main body of the spray nozzle 7 in the periphery of the fixing portion 25, this notch might function as the heat conduction restricting means 21.

Further, in case of employing an arrangement in which the vaporizer 8 and the spray nozzle 7 are not connected through the fixing portion 25 as shown in FIG. 2 but are formed as a uniform body, similar effects can be achieved by forming a wall thickness of a region of FIG. 2 corresponding to the heat conduction restricting means 21 to be thinner than those of its periphery.

Fixing of the fixing portion 25 for fixedly attaching the vaporizer 8 and the spray nozzle 7 might be effected by fixing through welding or brazing or by fixing utilizing a gasket.

The cooling mechanism according to the present invention is composed of a compulsory cooling portion and a heat conduction cooling portion which is in contact with the compulsory cooling portion and the spray nozzle, wherein the cooling means of the compulsory cooling portion performs cooling, besides circulation of cooling liquid, by cooling through a heat pipe, thermoelectric cooling using Peltier elements or cooling by combining these.

A cooling temperature achieved by the compulsory cooling is so designed that the temperature of source materials in the proximity of the tip end of the spray nozzle is not more than 100° C., preferably not more than 60° C. In case this temperature is exceeded, thermal decomposition of source material solutions occur and origomer thereof are formed while deposition occurs in case the temperature is less than a freezing point of the source materials.

Further, in case of source material solutions, the temperature needs to be set to a temperature with which no deposition in terms of solubility is generated.

Also, the provision of the heat insulating mechanism for heat-insulating the heated vaporizer and the cooled spray nozzle as shown in FIG. 1 is preferable since it is capable of more reliably maintaining the cooling temperature. It further makes it possible to achieve heating on the side of the vaporizer in an effective manner.

The heat insulating mechanism might be one which provides heat insulating by using heat-insulating materials besides the above-mentioned heat insulating mechanism through vacuum or a combination of these.

Embodiment 2

Figure 3:
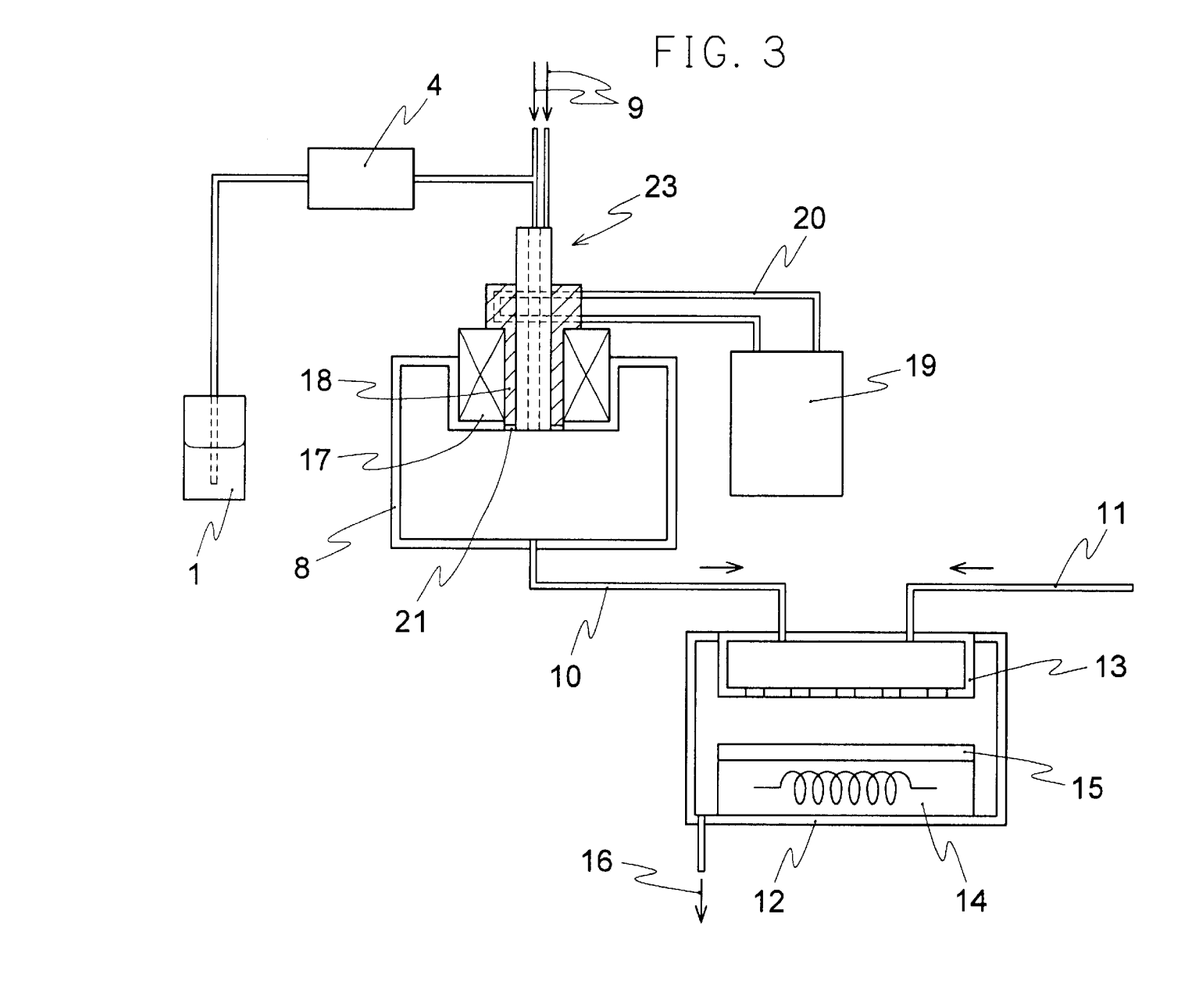
FIG. 3 is a schematic view of a CVD apparatus employing the vaporizing device for CVD source materials according to a second embodiment of the present invention.

FIG. 3 is a schematic view showing an arrangement of a CVD apparatus utilizing the vaporizing device for CVD source materials according to a second embodiment of the present invention wherein numeral 23 denotes a spray nozzle of coaxial double tube structure which is composed of an inner tube and an outer tube for making gas containing the CVD source materials and spray gas for spraying these CVD source materials flow in a separate manner.

Either one of the gas containing the CVD source materials and the spray gas for spraying these CVD source materials might be made to flow through the inner tube or the outer tube of the spray nozzle 23, and it is also possible to make the CVD source materials and the spray gas respectively flow through the inner tube and the outer tube, and a part of the spray gas might be distributed with the CVD source materials.

By utilizing the spray nozzle 23, drops of the source material solution to be sprayed into the vaporizer become small and uniform to thereby enable carburetion in an effective and stable manner. Consequently, generation of non-vaporized residues and particles could be decreased and it is enabled to achieve for improvements in productivity owing to elongation of continuous operation time of the vaporizing device and decrease in film forming deficiencies.

As for materials used for the spray nozzle of double tube structure composed of the inner tube and the outer tube, while both of the outer tube and the inner tube might be formed of metallic tubes such as stainless steel tubes, it is also possible to employ resin exhibiting heat resistant and solvent resistant characteristics such as fluorine group resin, polyimide or polybenzimidazole instead of metal.

In case only the tip end portion of the inner tube and/or outer tube of the double tube or the tube containing CVD source material gas is formed of the above resin tube, it can be desirably restricted for adhesion of source material solution or reaction thereof.

The spray nozzle for making gas containing CVD source materials and spray gas for making these CVD source materials flow in a separate manner might also be so arranged that tip end portions of a plurality of tubes for making the respective gases flow in a separate manner are provided proximate to each other to assume an atomizing structure.

Embodiment 3

Figure 4:
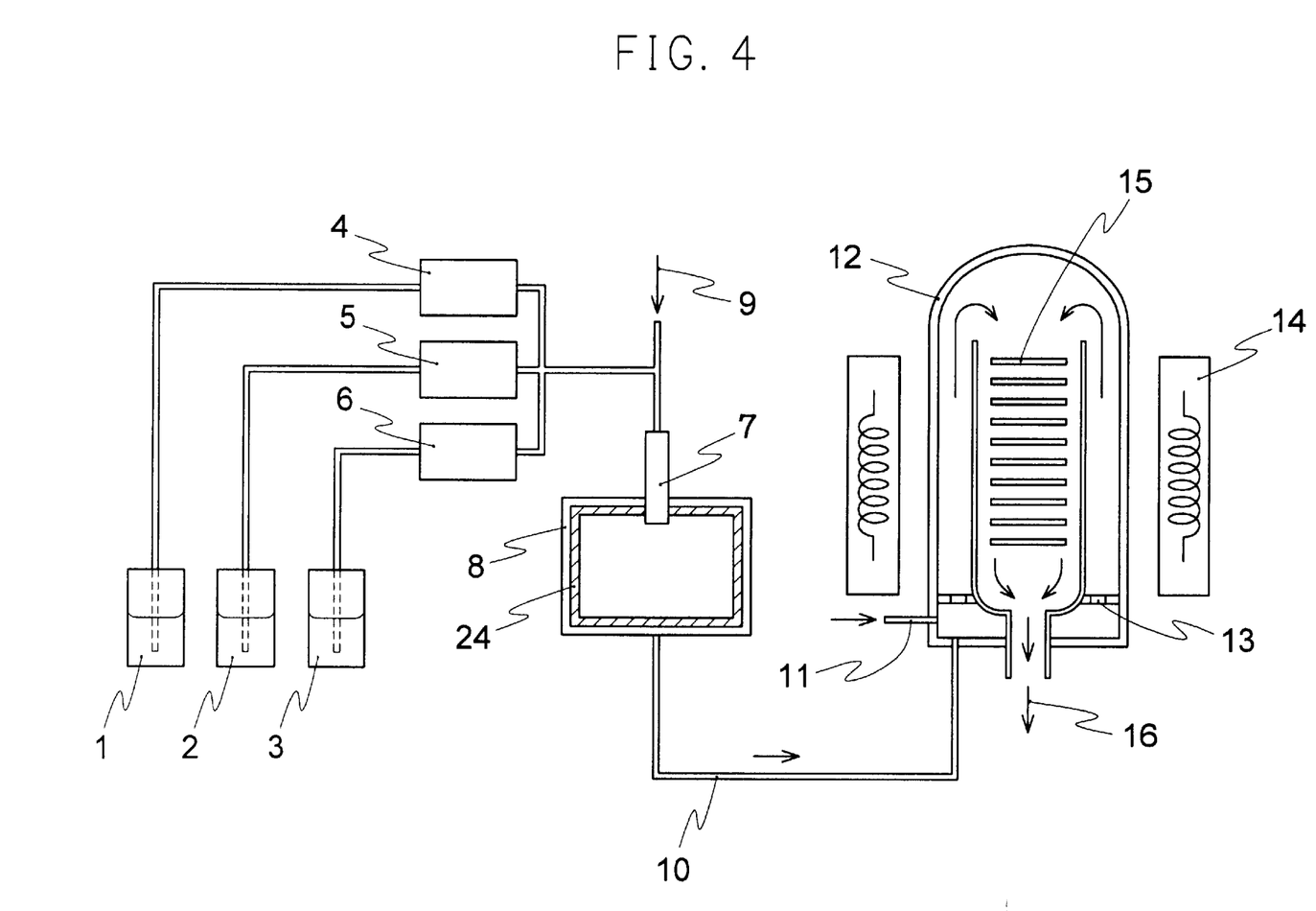
FIG. 4 is a schematic view of a CVD apparatus employing the vaporizing device for CVD source materials according to a third embodiment of the present invention.

FIG. 4 is a schematic view showing an arrangement of a CVD apparatus utilizing the vaporizing device for CVD source materials according to a third embodiment of the present invention wherein numeral 24 denotes a coating film. This coating film might be a coating film of nickel, chrome or oxides thereof, a coating film of an alloy containing nickel or chrome as main components or oxides thereof, a coating film of heat-resistant resin such as fluorine group resin or polyimide group resin, a coating film of a glass such as quartz, borosilicate glass, fluorine group glass, phosphate glass or porcelain enamel, or a coating film of ceramics such as alumina (alumite), silicon nitride, aluminum nitride, silicon carbide, titania or titanium nitride, and might also be a film in which either of the above coating film materials are used in combination.

While the above coating film 24 is formed on the inner wall of the vaporizer 8 in FIG. 4, the provision of the coating film on at least a part of surfaces of the spray nozzle 7 or the vaporizer 8 within the vaporizing device makes it possible to decrease generation of non-vaporized residues and particles on surfaces of materials employed for forming the vaporizing device and to achieve for improvements in productivity owing to elongation of the continuous operation time of the vaporizing device and decrease in film forming deficiencies.

However, depending on the relationship between the coating materials and underlying materials, there might be arisen a case where these coating films are impossible to be formed or present extremely poor adhesiveness so that the coating materials need to be suitably selected depending on the used underlying materials.

In case the heat conduction is poor, the thickness of the coating is set to be small and in case it is favorable, the thickness might also be large.

It should be noted by combining the above Embodiments 1 to 3, for instance, by forming the coating film according to the Embodiment 3 on surfaces of the vaporizer and spray nozzle according to the Embodiments 1 and 2, it is enabled to decrease generation of non-vaporized residues and particles and to achieve for improvements in productivity owing to elongation of the continuous operation time of the vaporizing device and decrease in film forming deficiencies.

Embodiments of the present invention will now be described.

Comparative Example 1

Figure 6:
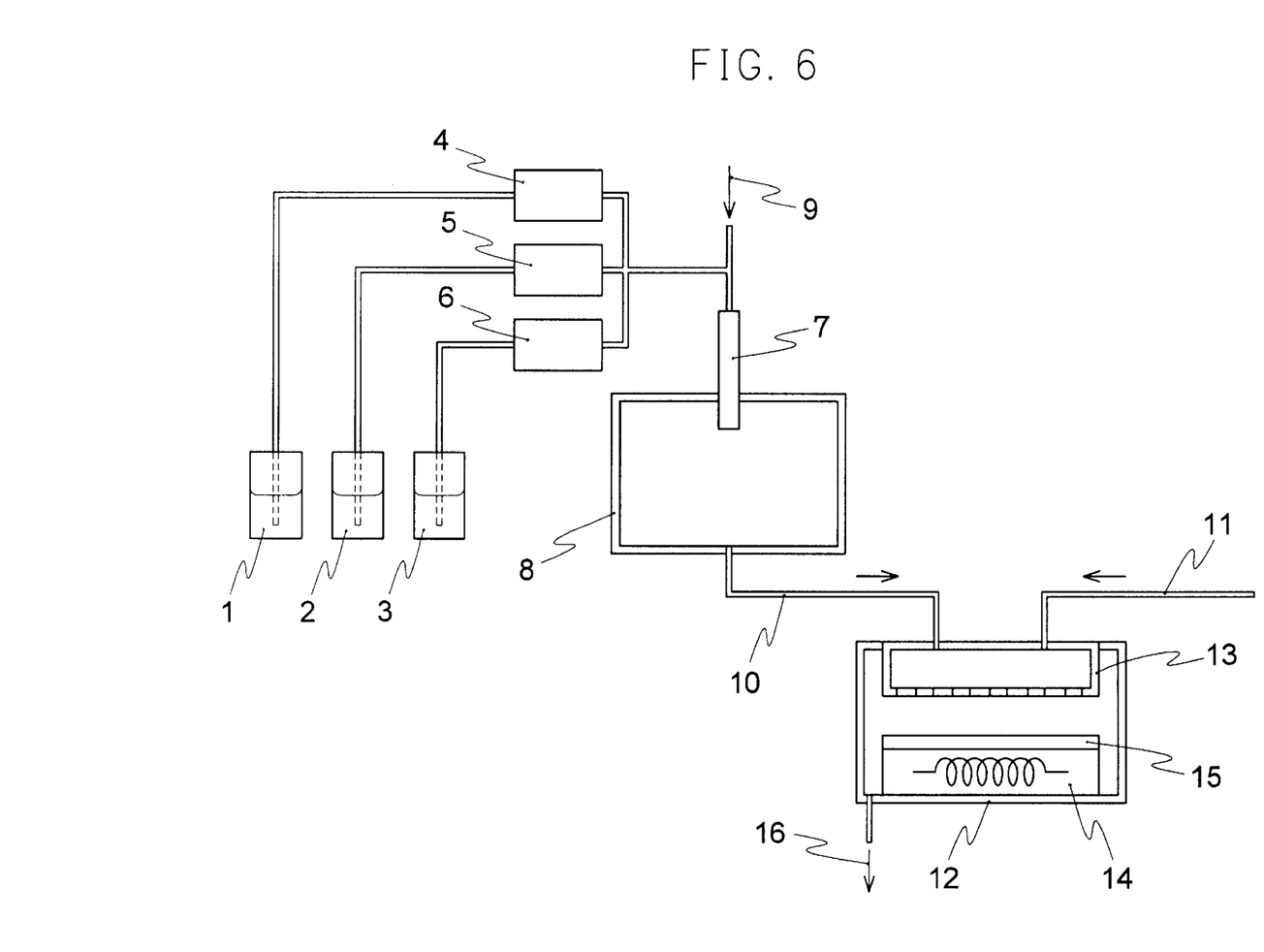
FIG. 6 is a schematic view of a conventional CVD apparatus.

FIG. 6 is a schematic view showing an arrangement of a CVD apparatus utilizing a conventional vaporizing device for CVD source materials wherein each of the parts is connected through welding and brazing. It will now be explained for a case in which BST group dielectric films are formed by utilizing the above device.

Respective source material solutions 1 to 3 of Ba, Sr and Ti each of a density of 0.1 mol/l obtained by dissolving DPM (dipivaloylmethanate) group source materials in THF were sprayed for carburetion through liquid supplying means 4 to 6 by required amounts through the spray nozzle 7 at a flow rate of 1 to 5 ml per minute together with nitrogen gas from the spray gas supply tube 9 (flow rate: 300 CCM) into the vaporizer 8 which has been heated to 200 to 250° C. Portions which are composed of the spray nozzle 7 and the vaporizer 8 form the vaporizing device for CVD source materials.

Vaporized source material gas was sent into the CVD reactor 12 by passing through the source material gas supply tube 10. In the CVD reactor 12, the source material gas was intermingled within the CVD gas nozzle 13 with reaction gas (oxygen) which has been sent from the reaction (oxide) gas supply tube 11 to form a BST group dielectric film on the substrate 15 disposed on the heating heater 14.

However, non-vaporized residues started to be generated upon performing carburetion for approximately 30 minutes in the above vaporizing devices and film deficiencies started to be generated owing to particles which are considered to be due to non-vaporized residues after approximately 60 minutes.

EXAMPLE 1

In a CVD apparatus including the vaporizing device according to the present invention shown in FIG. 1, a stainless steel tube was employed as the spray nozzle 7, a stainless steel plate of a small thickness having a thickness of approximately 0.5 mm was employed as the heat conduction restricting means 21 (FIG. 2(a)), heat insulation through vacuum was utilized as the heat-insulating mechanism 17, and an arrangement composed of the compulsory cooling portions 19, 20 utilizing circulation of cooling liquid (water) and of the heat conduction restricting portion provided by the copper metallic block 18 was employed as the cooling mechanism. The remaining arrangements were similar to those of Comparative Example 1 and the BST group dielectric film was formed accordingly.

It should be noted that each of the parts was connected through suitable connecting methods such as welding and brazing.

More particularly, utilizing respective solutions of Ba, Sr and Ti of a density of 0.1 mol/l as source material solutions 1 to 3 obtained by dissolving DPM group source materials in THF respectively at a flow rate of 0.1 to 2 ml per minute, carburetion was performed at a cooling temperature of 5 to 20° C. for the spray nozzle 7, a flow rate of 300 CCM for the spray gas (nitrogen) and a vaporizing temperature of 200 to 250° C. to perform vaporizing tests for 300 minutes and film forming tests during the same period.

It was found that only an extremely small amount of residues was generated within the vaporizer and that no decrease in repeatability of film forming (generation of defect articles) due to particles in the formed BST dielectric films were observed. Moreover, periodic maintenance times could be reduced owing to elongation of continuous operation time of the vaporizer so that productivity of final semiconductor memories could be improved.

The reason why the amount of generated non-vaporized residues could be remarkably reduced in the vaporizing device of the present invention in this manner is considered to be that the source material solutions stay in a cooled state immediately before they are sprayed into the heated vaporizer 8 and the thermal hysteresis applied to the source material solutions at the time of performing carburetion is extremely rapid whereby precursors and origomer of compound oxides that exhibit poor vaporizing characteristics are hardly formed.

In contrast to that, it is considered that the thermal hysteresis applied to the source material solution is slacked in the above Comparative Example whereby quite a large rise in temperature is generated before spraying so that non-vaporized residues are apt to be generated.

Further, since carburetion becomes generally more difficult the higher the density of the solution becomes, the vaporizing device of the present invention provided with the cooling mechanism for cooling the spray nozzle 7 is more advantaged in that it is capable of restricting evaporation of solution before the carburetion and thus of restricting increases in concentration of the solution before spraying.

Figure 5:
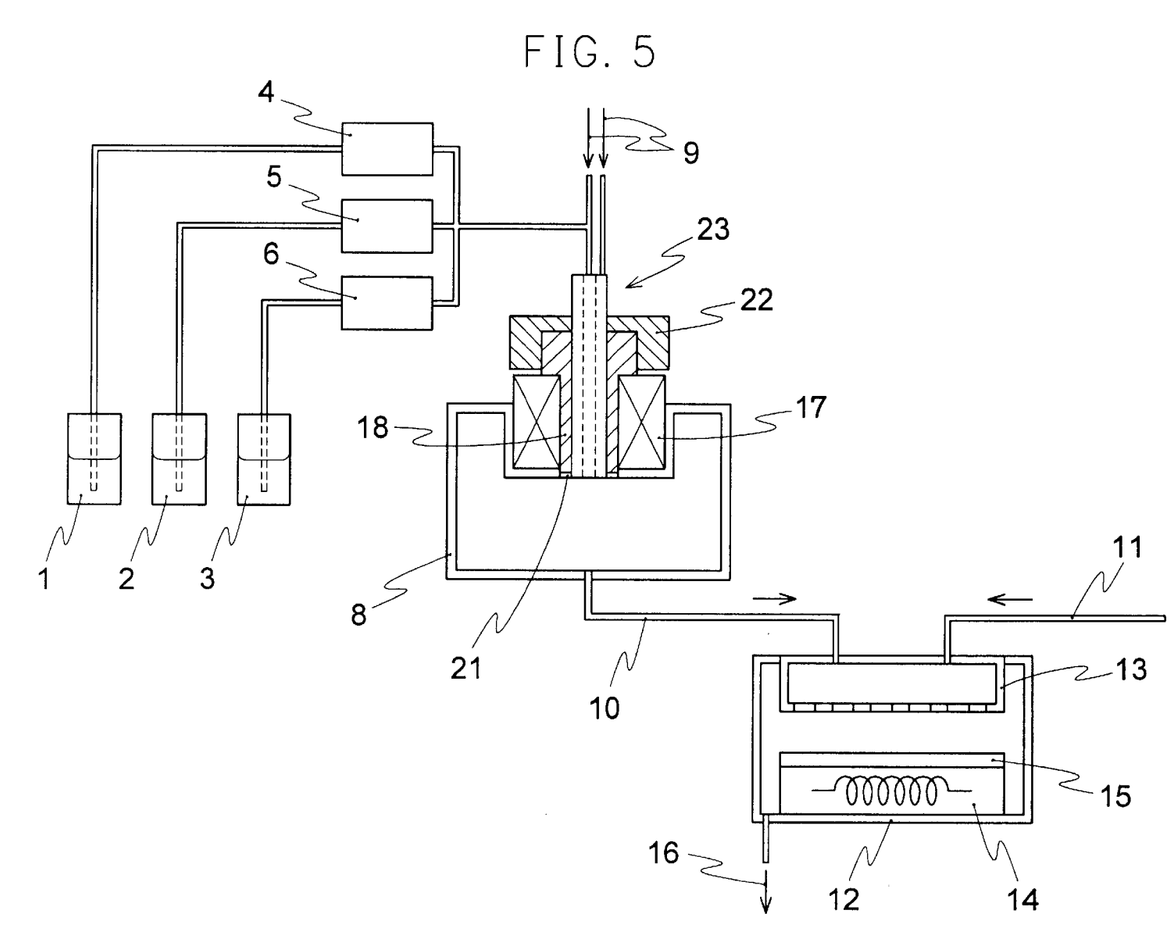
FIG. 5 is a schematic view of a CVD apparatus employing the vaporizing device for CVD source materials according to an embodiment of the present invention.

FIG. 5 is a schematic view showing an arrangement of a CVD apparatus including the vaporizing device of the present invention utilizing thermoelectric cooling through Peltier elements 22 instead of the cooling mechanism 19, 20 of FIG. 1. In the drawing, numeral 22 denotes Peltier elements by which the metallic block 18 is cooled.

While results of carburetion and film forming of source material solutions for forming BST dielectric films are shown in the illustrated example, it is possible to perform carburetion by utilizing the vaporizing device for CVD source materials of the present example to provide stable and long-term carburetion, so long as the CVD source materials are solutions or liquid state materials of Ta alkoxide source materials for Ta oxides, Cu complex source materials for Cu wiring, ferroelectrics of Bi—Sr—Ta group or Pb—Zr—Ti group or other materials of various ceramics, metallic films, metallic oxides, glass or superconductors.

EXAMPLE 2

In a CVD apparatus including the vaporizing device for CVD source materials according to the present invention shown in FIG. 3, both inner and outer tubes of the spray nozzle 23 of double tube structure are formed of stainless steel tubes wherein CVD source materials are made to flow through the inner tube and spray gas for spraying the CVD source materials through the outer tube.

A thin stainless steel plate having a thickness of approximately 0.5 mm was employed as the heat conduction restricting means 21 similarly to that of Example 1, a foam fluoride resin group heat insulating material was utilized as the heat-insulating mechanism 17, and an arrangement composed of the compulsory cooling portions 19, 20 utilizing circulation of cooling liquid (water) and of the heat conduction restricting portion provided by a stainless steel metallic block was employed as the cooling mechanism. Connection of each of the parts was performed through suitable connecting methods such as welding and brazing.

Utilizing a Ru solution of a concentration of 0.1 mol/l as a source material solution 1 obtained by dissolving a DPM group source material in THF at a flow rate of 5 ml per minute, carburetion was performed at a cooling temperature of 5 to 20° C. for the nozzle, a flow rate of 150 ccm for the spray gas (argon), a flow rate of 1,000 CCM for the reaction gas (hydrogen) and a vaporizing temperature of 180 to 200° C. to perform vaporizing tests for 300 minutes and film forming tests during the same period similarly to the case of Example 1.

It was found that by employing a spray nozzle of double tube structure, the amount of generated residues could be further decreased than compared to a vaporizer employing an ordinary single tube nozzle.

No decrease in repeatability of film forming (generation of defect articles) due to particles in the formed Ru electrode films was observed.

Further, productivity of final semiconductor memories including Ru electrode films or electronic parts could be improved owing to elongation of continuous operation time of the vaporizer.

The reason why the amount of generated non-vaporized residues could be reduced in the vaporizing device employing a spray nozzle of double tube structure according to the present invention is considered to be due to the fact that an atomizing structure was formed at the tip end portion through the double tube structure whereby drops of the source material solution to be sprayed became small and uniform, and that a spraying area with respect to the vaporizer was increased to enable carburetion in a more effective manner.

While the CVD source material was made to flow through the inner tube and the spray gas through the outer tube in the illustrated example, similar effects might be obtained by an opposite arrangement wherein the spray gas is made to flow through the inner tube and the CVD material through the outer tube. Further, spray gas might be made to flow both of the outer tube and the inner tube so that either one is arranged to make source material and spray gas flow through in a simultaneous manner.

EXAMPLE 3

Film forming tests of Cu electrode films were performed in a similar manner to that of Example 2 expect for the point that a Cu solution of a concentration of 0.1 mol/l obtained by dissolving a DPM group material in THF was used as a source material solution 1.

It was found that the amount of generated residues could be further decreased than compared to a vaporizer employing an ordinary single tube nozzle, similarly to Example 2 and that no decrease in repeatability of film forming (generation of defect articles) due to particles in the formed Cu electrode films was observed.

Further, productivity of final semiconductor memories including Cu electrode films or electronic parts could be improved owing to elongation of continuous operation time of the vaporizer.

EXAMPLE 4

In a CVD apparatus including the vaporizing device for CVD according to the present invention shown in FIG. 4, a PZT group dielectric film was formed using the CVD apparatus with a nickel coating having a thickness of 20 to 100 $\mu$m as the coating film 24 on inner surfaces of the vaporizer 8.

The material for the vaporizer 8 was stainless steel and the spray nozzle 7 was formed of a Teflon tube.

More particularly, utilizing respective solutions of Pb, Zr and Ti of a concentration of 0.3 mol/l as source material solutions 1 to 3 obtained by dissolving DPM group source materials in THF respectively at a flow rate of 5 ml per minute, carburetion was performed at a flow rate of 300 CCM for the spray gas and a vaporizing temperature of 200° C. to perform vaporizing tests for 300 minutes and film forming tests during the same period.

It was consequently found that the amount of generated non-vaporized residues within the vaporizer could be decreased to approximately half of the amount in case no nickel coating film 24 was provided, so that elongation of continuous operation time of the vaporizing device could be achieved.

Further, decrease in repeatability of film forming (generation of defect articles) due to particles in the formed PZT film could be reduced.

The reason why the amount of generated non-vaporized residues could be reduced in the vaporizing device of the illustrated example is considered to be due to the face that the surface of the stainless steel promotes decomposition of source materials while the extent of decomposition by nickel is small.

While the illustrated example is related to a case employing a nickel coating film, similar effects might be obtained by utilizing a coating film of chrome, a coating film of an oxide of nickel or chrome, a coating film of an alloy containing nickel or chrome as a main component or of an oxide of these, a coating film of heat-resistant resin, a coating film of a glass, or a coating film of ceramics.

EXAMPLE 5

A CVD vaporizing device obtained by combining those of the above Examples 1 to 3 was used. Explaining this CVD vaporizing device based on FIG. 1, the spray nozzle 7 of FIG. 1 was replaced by the spray nozzle 23 of Example 2 (FIG. 3), and a coating film 24 was formed on the inner surface of the vaporizer 8 (FIG. 4) and a coating film of chrome oxide layer on the inner surface of the spray nozzle 23 (not shown).

More particularly, utilizing respective solutions of Ba, Sr and Ti of a concentration of 0.1 mol/l as source material solutions 1 to 3 obtained by dissolving DPM group source materials in THF respectively, and employing stainless steel tubes as the outer tube and the inner tube of the spray nozzle 23 of double tube structure, the CVD source material solutions were made to flow through the inner tube and spray gas through both the outer tube and the inner tube, and the flow rate of spray gas (nitrogen) was set to be 200 CCM, respectively.

Carburetion of the respective source materials of a flow rate of 0.1 to 5 ml per minute was performed at a cooling temperature of 5 to 20° C. for the spray nozzle and a vaporizing temperature of 200 to 250° C. to perform vaporizing tests for 300 minutes and film forming tests during the same period, similarly to Example 1.

It was found that only an extremely small amount of residues were generated within the vaporizer and that no decrease in repeatability of film forming (generation of defect articles) due to particles in the formed BST dielectric films was observed. Moreover, periodic maintenance time could be reduced owing to elongation of continuous operation time of the vaporizer so that productivity of final semiconductor memories could be improved.

A first vaporizing device for CVD source materials according to the present invention comprises a vaporizer for vaporizing introduced CVD source materials through heating, a spray nozzle of which end portion is fixedly attached to the vaporizer for spraying the CVD materials into the vaporizer, a cooling mechanism for cooling the spray nozzle, and a heat conduction restricting means which is attached either to the fixing portion, or to a portion of the spray nozzle or the vaporizer proximate of the fixing portion. With this arrangement, there can be achieved for an effect that generation of non-vaporized residues and particles can be decreased and that improvements in productivity owing to elongation of continuous operation time and decrease in film forming deficiencies can be achieved.

A second vaporizing device for CVD source materials according to the present invention is so arranged that the first vaporizing device for CVD source materials further includes a heat insulating mechanism for thermally insulating the vaporizer from the cooled spray nozzle. With this arrangement, there can be achieved for an effect that generation of non-vaporized residues and particles can be decreased and that improvements in productivity owing to elongation of continuous operation time and decrease in film forming deficiencies can be achieved.

A third vaporizing device for CVD source materials according to the present invention is so arranged that in the first or second vaporizing device for CVD source materials, the heat conduction restricting means is configured to assume a wall thickness which is smaller than a wall thickness of the vaporizer or the spray nozzle disposed in a periphery of the heat conduction restricting means. With this arrangement, there can be achieved for an effect that generation of non-vaporized residues and particles can be decreased and that improvements in productivity owing to elongation of continuous operation time and decrease in film forming deficiencies can be achieved.

A fourth vaporizing device for CVD source materials according to the present invention is so arranged that in the third vaporizing device for CVD source materials, the heat conduction restricting means is formed of a metallic plate of which thickness is smaller than the wall thickness of the vaporizer. With this arrangement, there can be achieved for an effect that generation of non-vaporized residues and particles can be further decreased and that improvements in productivity owing to elongation of continuous operation time and decrease in film forming deficiencies can be achieved.

A fifth vaporizing device for CVD source materials according to the present invention is so arranged that in the fourth vaporizing device for CVD source materials, a wall surface of the metallic plate of a small thickness is covered with glass, ceramics or heat-resisting plastics. With this arrangement, there can be achieved for an effect that generation of non-vaporized residues and particles can be further decreased and that improvements in productivity owing to elongation of continuous operation time and decrease in film forming deficiencies can be achieved.

A sixth vaporizing device for CVD source materials according to the present invention is so arranged that in either one of the first to fifth vaporizing devices for CVD source materials, the spray nozzle is configured to make gas containing the CVD source materials and spray gas for spraying the CVID source materials flow in a separate manner. With this arrangement, there can be achieved for an effect that generation of non-vaporized residues and particles can be further decreased and that improvements in productivity owing to elongation of continuous operation time and decrease in film forming deficiencies can be achieved.

A seventh vaporizing device for CVD source materials according to the present invention is so arranged that in the sixth vaporizing device for CVD source materials, the spray nozzle is formed as a double tube structure composed of an inner tube and an outer tube wherein gas containing the CVD source materials is made to flow through one of the tubes and spray gas for spraying the CVD source materials is made to flow through the other one of the tubes. With this arrangement, there can be achieved for an effect that generation of non-vaporized residues and particles can be further decreased and that improvements in productivity owing to elongation of continuous operation time and decrease in film forming deficiencies can be achieved.

An eighth vaporizing device for CVD source materials according to the present invention is so arranged that in the seventh vaporizing device for CVD source materials, the double tube is made of metal, resin or a complex of these. With this arrangement, there can be achieved for an effect that generation of non-vaporized residues and particles can be further decreased and that improvements in productivity owing to elongation of continuous operation time and decrease in film forming deficiencies can be achieved.

A ninth vaporizing device for CVD source materials according to the present invention is so arranged that in the eighth vaporizing device for CVD source materials, either a tip end portion of the double tube or the tube through which the CVD source material is made to flow is formed of resin. With this arrangement, there can be achieved for an effect that generation of non-vaporized residues and particles can be further decreased and that improvements in productivity owing to elongation of continuous operation time and decrease in film forming deficiencies can be achieved.

A tenth vaporizing device for CVD source materials according to the present invention is so arranged that in the eighth vaporizing device for CVD source materials, the outer tube of the double tube is formed of metal. With this arrangement, the tube can be manufactured easily, and there can be achieved for an effect that generation of non-vaporized residues and particles can be further decreased and that improvements in productivity owing to elongation of continuous operation time and decrease in film forming deficiencies can be achieved.

An eleventh vaporizing device for CVD source materials according to the present invention is so arranged that in either one of the eighth to tenth vaporizing devices for CVD source materials, the resin is fluorine group resin, polyimide or polybenzimidazole. With this arrangement, there can be achieved for an effect that generation of non-vaporized residues and particles can be further decreased and that improvements in productivity owing to elongation of continuous operation time and decrease in film forming deficiencies can be achieved.

A twelfth vaporizing device for CVD source materials according to the present invention is so arranged that in either one of the first to seventh vaporizing devices for CVD source materials, surfaces of inner walls of the spray nozzle or the inner walls of the vaporizer are formed with a coating film of nickel, chrome or an oxide thereof, a coating film of an alloy including as main components nickel or chrome or an oxide thereof, a coating film of heat-resisting resin, a coating film of holohyaline, or a coating film of ceramics. With this arrangement, there can be achieved for an effect that generation of non-vaporized residues and particles can be further decreased and that improvements in productivity owing to elongation of continuous operation time and decrease in film forming deficiencies can be achieved.

A thirteenth vaporizing device for CVD source materials according to the present invention is so arranged that in a vaporizing device for CVD source materials comprising a vaporizer for vaporizing introduced CVD source materials through heating and a spray nozzle for spraying the CVD materials into the vaporizer, surfaces of inner walls of the spray nozzle or the inner walls of the vaporizer are formed with a coating film of nickel, chrome or an oxide thereof, a coating film of an alloy including as main components nickel or chrome or an oxide thereof, a coating film of heat-resisting resin, a coating film of holohyaline, or a coating film of ceramics. With this arrangement, there can be achieved for an effect that generation of non-vaporized residues and particles can be further decreased and that improvements in productivity owing to elongation of continuous operation time and decrease in film forming deficiencies can be achieved.

A fourteenth CVD apparatus according to the present invention comprises any one of the above first to thirteenth vaporizing devices for CVD source materials, a supply portion for supplying the CVD source materials into the vaporizing device for CVD source materials and a reacting portion for forming a layer on a substrate through reaction of the source materials which have been vaporized by the vaporizing device for CVD source materials. With this arrangement, favorable film forming can be performed and improvements in productablity of manufacture of memories or electronic parts can be achieved.

What is claimed is:

1. A vaporizing device for vaporizing chemical vapor deposition (CVD) source materials comprising:

a vaporizer for vaporizing introduced CVD source materials by heating, the vaporizer including a chamber for vaporization of the CVD source materials, the chamber having an inlet for introducing the CVD source materials into the chamber and a heat conductive chamber wall heated during vaporization of the CVD source materials, a spray nozzle having an end fixedly attached to the inlet of the chamber for spraying the CVD source material into the chamber, cooling means disposed outside the chamber and having a cooling portion coupled to the spray nozzle for cooling the spray nozzle, and heat conduction restricting means for restricting heat conduction from the chamber wall to the spray nozzle, the heat conduction restricting means being disposed between the chamber and the end of the spray nozzle, forming an airtight seal between the spray nozzle and the chamber.

2. The vaporizing device for vaporizing CVD source materials of claim 1, wherein the vaporizing device further includes a heat insulating means thermally insulating the chamber wall from the spray nozzle.

3. The vaporizing device for vaporizing CVD source materials of claim 1, wherein the vaporizer has a vaporizer wall with a thickness and including heat conduction restricting means thermally insulating the vaporizer wall from the spray nozzle, comprising a plate having a thickness smaller than the thickness of the wall of the vaporizer, and disposed at a periphery of the spray nozzle.

4. The vaporizing device for vaporizing CVD source materials of claim 3, wherein the plate is metal and at least a part of the metal plate is covered by one of a glass, a ceramic, and a heat-resisting plastic.

5. The vaporizing device for vaporizing CVD source materials of claim 1, wherein one of an inner wall of the spray nozzle and the chamber is coated with a film of a material selected from the group consisting of nickel, chrome, an oxide of nickel, an oxide of chrome, an alloy including as a main component one of nickel, chrome, an oxide of nickel, and an oxide of chrome, a heat-resisting resin, a glass, and a ceramic.

6. The vaporizing device for vaporizing CVD source materials of claim 1, wherein the spray nozzle includes first and second coaxial tubes, the first tube for passage of the CVD source materials and the second tube for passage of a spray gas for spraying the CVD source materials into the chamber.

7. The vaporizing device for vaporizing CVD source materials of claim 6, wherein the first and second coaxial tubes are made of at least one material selected from the group consisting of a metal, a resin, a complex of a metal, and a resin.

8. The vaporizing device for vaporizing CVD source materials of claim 7, wherein a tip end of one of the first and second tubes is a resin.

9. The vaporizing device for vaporizing CVD source materials of claim 7, wherein an outer tube of the first and second tubes is metal.

10. A vaporizing device for vaporizing chemical vapor deposition (CVD) source materials comprising:

a vaporizer for vaporizing CVD source materials by heating, the vaporizer including a chamber having a heat conductive chamber wall with an inlet for introducing the CVD source materials into the chamber;

a spray nozzle having a first end located to spray a CVD source material into the chamber through the inlet;

a plate, having at least a portion thinner than the chamber wall, contacting and locating the spray nozzle relative to the inlet to spray CVD source materials into the chamber, the plate limiting thermal conduction from the chamber wall, thereby providing thermal insulation of the spray nozzle from the chamber wall;

a cooling block in contact with and surrounding the spray nozzle for conducting heat from and cooling the spray nozzle; and a vacuum region between the cooling block and the chamber wall, thermally isolating the spray nozzle and the cooling block from the chamber wall.

11. The vaporizing device for vaporizing CVD source materials of claim 10, wherein the plate is a metal plate and covered by one of a glass, a ceramic, and a heat-resisting plastic.

12. The vaporizing device for vaporizing CVD source materials of claim 10, wherein the spray nozzle includes first and second coaxial tubes, the first tube for passage of the CVD source materials and the second tube for passage of a spray gas for spraying the CVD source materials into the chamber.

13. The vaporizing device for vaporizing CVD source materials of claim 12, wherein the first and second coaxial tubes are made of at least one material selected from the group consisting of a metal, a resin, a complex of a metal, and a resin.

14. The vaporizing device for vaporizing CVD source materials of claim 13, wherein a tip end of one of the first and second tubes is a resin.

15. The vaporizing device for vaporizing CVD source materials of claim 13, wherein an outer tube of the first and second tubes is metal.

16. The vaporizing device for vaporizing CVD source materials of claim 10, wherein one of an inner wall of the spray nozzle and the chamber is coated with a film of a material selected from the group consisting of nickel, chrome, an oxide of nickel, an oxide of chrome, an alloy including as a main component one of nickel, chrome, and an oxide of nickel, an oxide of chrome, a beat-resisting resin, a glass, and a ceramic.

17. A chemical vapor deposition (CVD) apparatus comprising:

a vaporizer for vaporizing CVD source materials by heating, the vaporizer including a chamber having a heat conductive chamber wall with an inlet for introducing the CVD source materials into the chamber;

a spray nozzle having a first end located to spray a CVD source material into the chamber through the inlet;

a plate, having at least a portion thinner than the walls of the chamber, contacting and locating the spray nozzle relative to the inlet to spray CVD source materials into the chamber, the plate limiting thermal conduction from the chamber wall, thereby providing thermal insulation of the spray nozzle from the chamber wall;

a cooling block in contact with and surrounding the spray nozzle for conducting heat from and cooling the spray nozzle;

a vacuum region between the cooling block and the chamber wall, thermally isolating the spray nozzle and the cooling block from the chamber wall; and a reaction chamber receiving the CVD source materials vaporized by the vaporizing device for forming a film on a substrate through reaction of the CVD source materials.

18. The CVD apparatus of claim 17, wherein the plate is a metal plate and covered by one of a glass, a ceramic, and a heat-resisting plastic.

19. The CVD apparatus of claim 17, wherein the spray nozzle includes first and second coaxial tubes, the first tube for passage of the CVD source materials and the second tube for passage of a spray gas for spraying the CVD source materials into the chamber.

20. The CVD apparatus of claim 17 wherein an inner wall of one of the spray nozzle and the vaporizer includes a coating of a material selected from the group consisting of nickel, chrome, an oxide of nickel, an oxide of chrome, an alloy including as a main component one of nickel, chrome, an oxide of nickel, and an oxide of chrome, a heat-resisting resin, a glass, and a ceramic.

* * * * *

UNITED STATES PATENT AND TRADEMARK OFFICE
CERTIFICATE OF CORRECTION

PATENT NO.     : 6,273,957 B1
DATED          : August 14, 2001
INVENTOR(S)    : Yamamuka et al.

It is certified that error appears in the above-identified patent and that said Letters Patent is hereby corrected as shown below:

<u>Title page,</u>
Item [75], the order of the names of the inventors is as follows:
-- Shigeru Matsuno
Takehiko Sato
Akira Yamada
Masayoshi Tarutani
Mikio Yamamuka
Tsuyoshi Horikawa
Takaaki Kawahara
Fusaoki Uchikawa --

Signed and Sealed this

Seventeenth Day of June, 2003

JAMES E. ROGAN
*Director of the United States Patent and Trademark Office*